(12) United States Patent
Altman et al.

(10) Patent No.: US 7,548,424 B2
(45) Date of Patent: Jun. 16, 2009

(54) DISTRIBUTED TRANSMIT/RECEIVE INTEGRATED MICROWAVE MODULE CHIP LEVEL COOLING SYSTEM

(75) Inventors: David H. Altman, Framingham, MA (US); Joseph R. Ellsworth, Worcester, MA (US); Michael E. Null, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 11/716,864

(22) Filed: Mar. 12, 2007

(65) Prior Publication Data

US 2008/0225485 A1  Sep. 18, 2008

(51) Int. Cl.
*H05K 7/20* (2006.01)
*H01Q 3/22* (2006.01)

(52) U.S. Cl. .............. 361/699; 361/700; 165/80.3; 165/80.4; 165/80.5; 257/714; 342/372; 343/702; 343/720

(58) Field of Classification Search ......... 361/698–701, 361/704–710, 717–721, 749, 784, 785, 790, 361/735; 257/713, 714, 715; 62/259.1, 259.2, 62/238.1, 119; 165/80.4, 80.5, 104.19, 104.33, 165/47, 165, 170, 177, 281, 907; 343/858, 343/702, 893, 720; 342/70, 71, 72, 175
See application file for complete search history.

(56) References Cited

U.S. PATENT DOCUMENTS

| 4,851,856 | A | * | 7/1989 | Altoz ........................ 343/720 |
| 4,998,181 | A | * | 3/1991 | Haws et al. ................ 361/702 |
| 5,128,689 | A | * | 7/1992 | Wong et al. ................ 343/853 |
| 5,276,455 | A | * | 1/1994 | Fitzsimmons et al. ....... 343/777 |
| 5,459,474 | A | * | 10/1995 | Mattioli et al. ............... 343/702 |
| 5,901,037 | A |   | 5/1999 | Hamilton et al. |
| 5,901,783 | A |   | 5/1999 | Dobak, III et al. |
| 5,960,861 | A | * | 10/1999 | Price et al. .................. 165/80.3 |
| 5,998,240 | A |   | 12/1999 | Hamilton et al. |
| 6,005,531 | A | * | 12/1999 | Cassen et al. ................ 343/853 |
| 6,278,400 | B1 | * | 8/2001 | Cassen et al. ................ 342/175 |
| 6,292,364 | B1 | * | 9/2001 | Fitzgerald et al. ........... 361/699 |
| 6,388,317 | B1 | * | 5/2002 | Reese .......................... 257/713 |
| 6,469,671 | B1 | * | 10/2002 | Pluymers et al. ............. 343/702 |
| 6,611,430 | B1 | * | 8/2003 | Richard et al. ............... 361/704 |
| 6,615,997 | B2 |   | 9/2003 | Danello et al. |
| 6,665,184 | B2 | * | 12/2003 | Akselband ................... 361/699 |
| 6,784,837 | B2 | * | 8/2004 | Revankar et al. ............. 342/372 |
| 6,903,929 | B2 |   | 6/2005 | Prasher et al. |
| 6,903,931 | B2 |   | 6/2005 | McCordic et al. |
| 6,937,471 | B1 | * | 8/2005 | Haws et al. .................. 361/699 |

(Continued)

OTHER PUBLICATIONS

U.S. Appl. No. 11/447,488, filed Jun. 6, 2006, McCordic et al.

*Primary Examiner*—Michael V Datskovskiy
(74) *Attorney, Agent, or Firm*—Iandiorio Teska & Coleman

(57) ABSTRACT

A radar transmit and receive integrated microwave module with conductively cooled condenser side rails and one or more vacuum brazed fluid distribution manifold cold plates in fluid communication with the side rails. There are one or more transmit and receive modules on a cold plate. Each module includes a coolant input and a coolant output. One or more gallium nitride monolithic microwave integrated circuits are within each transmit and receive module and each include a micro heat exchanger in fluid communication with the coolant input and the coolant output of the transmit and receive module to directly cool the gallium nitride monolithic microwave integrated circuit.

11 Claims, 12 Drawing Sheets

U.S. PATENT DOCUMENTS

| | | | |
|---|---|---|---|
| 7,000,691 B1 * | 2/2006 | Weber | 165/281 |
| 7,017,651 B1 * | 3/2006 | Wilson et al. | 165/47 |
| 7,061,446 B1 * | 6/2006 | Short et al. | 343/893 |
| 7,115,987 B2 | 10/2006 | Holalkere et al. | |
| 7,178,586 B2 * | 2/2007 | Goldman et al. | 165/177 |
| 7,204,303 B2 * | 4/2007 | Thomas et al. | 165/170 |
| 7,227,753 B2 * | 6/2007 | Weber et al. | 361/700 |
| 7,272,880 B1 * | 9/2007 | Pluymers et al. | 29/428 |
| 2001/0045104 A1 | 11/2001 | Bailey, Sr. et al. | |
| 2004/0032275 A1 | 2/2004 | Cader et al. | |
| 2006/0214289 A1 * | 9/2006 | Hansen | 257/728 |
| 2007/0025078 A1 | 2/2007 | Silverstein | |
| 2007/0026676 A1 * | 2/2007 | Li et al. | 438/689 |
| 2007/0194384 A1 * | 8/2007 | Robinson | 257/367 |

* cited by examiner

DISTRIBUTED TRANSMIT/RECEIVE INTEGRATED MICROWAVE MODULE CHIP LEVEL COOLING SYSTEM

FIELD OF THE INVENTION

This invention relates to heat transfer and, in one particular example, cooling of a phased array radar system.

BACKGROUND OF THE INVENTION

Phased array radar systems often include numerous transmit and receive integrated microware modules housed in an equipment rack. See U.S. Pat. No. 6,615,997 incorporated herein by this reference. See also U.S. Pat. Nos. 6,903,931; 5,901,037; 5,998,240; 7,115,987; 6,903,929 and application Ser. No. 11/447,488 also incorporated herein by this reference.

Among other circuitry, each main module includes two to eight transmit and receive modules each located on a cold plate. Each transmit and receive module includes microwave circuitry built upon a gallium arsenide epitaxial layer to form a monolithic microwave integrated circuit (MMIC) in electrical communication with the transmit and receive structure of the main module. This integrated circuitry is conduction cooled via the cold plate which itself is cooled via an interface through the main module conductively coupled to structure within the equipment rack. A coolant circulates through the equipment rack for this purpose.

It is often desirable to provide more power to the microwave integrated circuitry. One proposed design includes the use of a gallium nitride epitaxial layer base for the microwave circuitry instead of gallium arsenide to operate at higher power levels. 10-20 W/mm gate power levels are expected in gallium nitride monolithic microwave integrated circuits in the future.

But, with greater power levels comes more heat and the traditional heat transfer configuration may not be able to sufficiently dissipate the heat generated by the gallium nitride monolithic microwave integrated circuits. At the same time, any new heat transfer configuration optimally does not adversely effect the present configuration of the main transmit and receive module or its form, fit, and function with present equipment racks and other sub-systems of the radar system. Extensive architectural changes to the radar system and subsystems are not desirable.

Due to the tight space between modules in the equipment rack, cooling methods available to cool the integrated circuitry are somewhat limited. Also, each module must be easily replaceable in the field.

Existing microcoolers are not suitable for cooling gallium nitride monolithic microwave integrated circuitry. Such microcoolers do not contain the required heat transfer area or incorporate advanced materials such as diamond. In addition, existing microcoolers are not based on advanced fabrication methods such as multilayer wafer bonding and deep reactive ion etching of silicon carbide and diamond or feature the use of multi-phase heat transfer as may be required for embedded gallium nitride MMIC cooling.

SUMMARY OF THE INVENTION

It is therefore an object of this invention to provide a new method of cooling microwave circuitry in radar systems.

It is a further object of this invention to provide a radar transmit and receive integrated module which adequately dissipates the heat generated by higher power gallium nitride monolithic microwave integrated circuits.

It is a further object of this invention to provide such a module which requires only minor enhancements to overall form and fit and which still properly interfaces with presently used equipment racks and the other sub-systems of a radar system.

It is a further object of this invention to provide such a method and module which takes advantage of modern microfluidic engineering practices and advances in microfabrication technology.

The subject invention results at least in part from the realization that by adding a micro heat exchanger made from highly conductive materials to the monolithic microwave integrated circuit of a radar system and adding a coolant input and coolant output to the transmit and receive module which houses the microwave integrated circuit, coolant can be delivered directly to the integrated circuitry itself to thermally manage the circuitry and to allow operation at higher power levels. By adding a miniature pump or compressor and a conduction cooled condenser, multiphase microfluidic cooling of a GaN based transmit and receive integrated microwave module can be accomplished.

This subject invention features a radar transmit and receive integrated microwave module. Typically, there are conductively cooled condenser side rails and one or more vacuum brazed fluid distribution manifold cold plates in fluid communication with the side rails. One or more transmit and receive modules are located on a cold plate. Each module includes a coolant input and a coolant output. One or more gallium nitride monolithic microwave integrated circuits are within each transmit and receive module and each includes a micro heat exchanger in fluid communication with the coolant input and the coolant output of the transmit and receive module to directly cool the gallium nitride monolithic microwave integrated circuit.

In one example, each transmit and receive module includes a package substrate with an input port and an output port therein in fluid communication with the coolant input and coolant output, respectively. Each gallium nitride monolithic microwave integrated circuit micro heat exchanger includes an input channel in fluid communication with the input port, an output channel in fluid communication with the output port, and a heat transfer structure between the input channel and the output channel. In one embodiment, the heat transfer structure includes fins. Further included may be a phase change coolant within the conductively cooled condenser side rails. In another embodiment, the heat transfer structure includes microchannels. In still another embodiment, the heat transfer structure includes an array of nozzles or impinging jets. Further included may be a pump for pumping fluid through the side rails or a compressor for sub-ambient operation.

One radar module in accordance with this invention includes cooled rails, one or more cold plates, and one or more transmit and receive modules on a cold plate. Each transmit and receive module includes a coolant input and a coolant output in fluid communication with the cooled rails, and one or more microwave integrated circuits within each transmit and receive module each including a heat exchanger for receiving coolant to directly cool the microwave integrated circuit.

One radar module in accordance with this invention includes at least one cold plate and at least one transmit and receive module on the cold plate. The module includes a coolant input and a coolant output, a microwave circuit within said module, and a heat exchanger for the microwave circuit in fluid communication with the coolant input and coolant output to directly cool the microwave circuit.

Typically, the cold plate is a vacuum brazed fluid distribution manifold, the microwave circuit is a gallium nitride monolithic integrated circuit, and the heat exchanger is integrated with the microwave circuit.

A radar module in accordance with this invention features at least one transmit and receive module including a coolant input and a coolant output, a microwave circuit within the module, and a heat exchanger for the microwave circuit in fluid communication with the coolant input and the coolant output to directly cool the microwave circuit.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
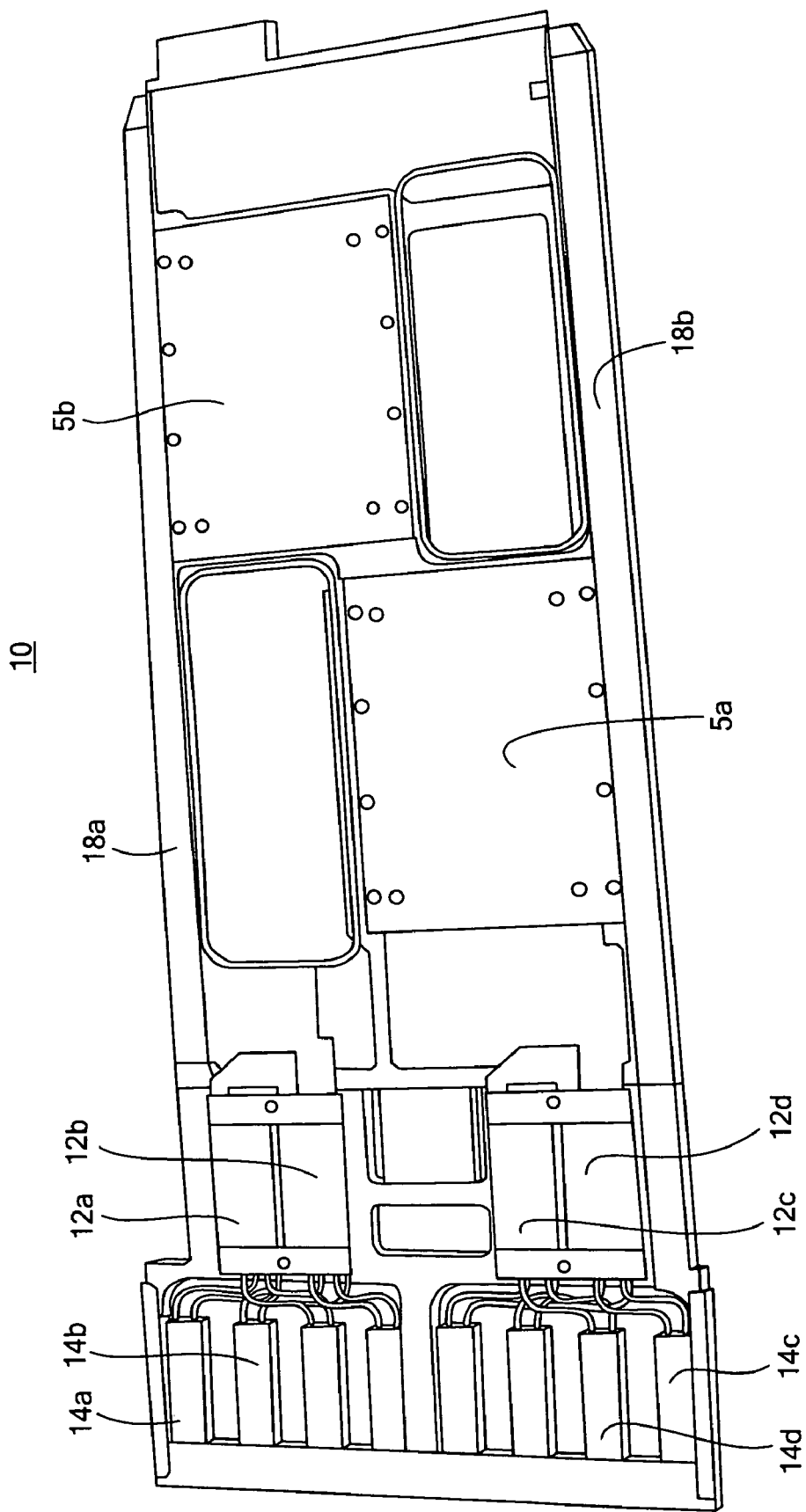
FIG. 1 is a highly schematic three-dimensional top view of a typical radar transmit and receive integrated microwave module.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 an example of a typical but non-limiting radar transmit and receive integrated microwave module 10. Among other circuitry on module 10 are power supplies 5a and 5b and transmit and receive modules 12a-12d each electrically connected to one or more polarizers 14a-14d. Each module 12 resides on a cold plate. Within each module 12 are typically two or more monolithic microwave integrated circuits. There are also four transmit and receive modules on the opposite side of module 10 (not shown).

Figure 2:
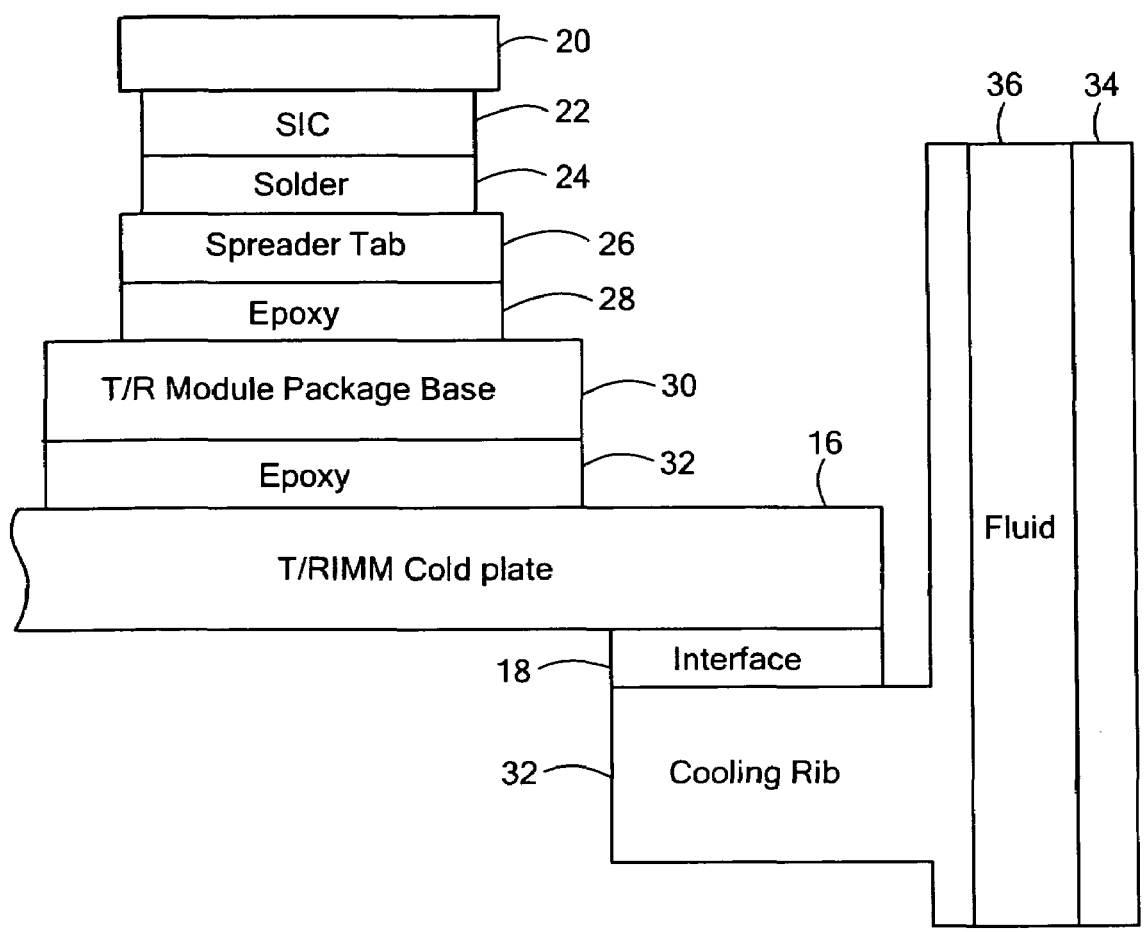
FIG. 2 is a highly schematic block diagram showing the heat dissipation path for the module shown in FIG. 1.

Side rails 18a and 18b of the main module 10 are received in a radar equipment rack which includes a coolant circulating therein. Thus, presently, cooling of each microwave circuit includes cooling its package, via a cold plate and side rails conductively coupled to coolant in the equipment side rack. As shown in FIG. 2, the active epitaxial layer of a monolithic microwave integrated circuit is shown at 20. There is a SiC substrate 22, AuSn solder 24, a copper moly spreader 26, epoxy 28 and then the base 30 of copper moly transmit and receive module package 12, FIG. 1. This module is secured to cold plate 16 of main module 10, FIG. 1 via epoxy 32, FIG. 2. Heat conducts from there to transmit and receive module side rail 18 to coolant rib 32 of equipment rack 34 where coolant 36 circulates.

As discussed in the background section above, when epitaxial layer 20 is formed of gallium arsenide, this heat transfer configuration is adequate. But, when gallium nitride is used and the microwave integrated circuitry is driven at a higher power, additional heat is generated and the heat transfer configuration shown in FIG. 2 may not be adequate.

Figure 3:
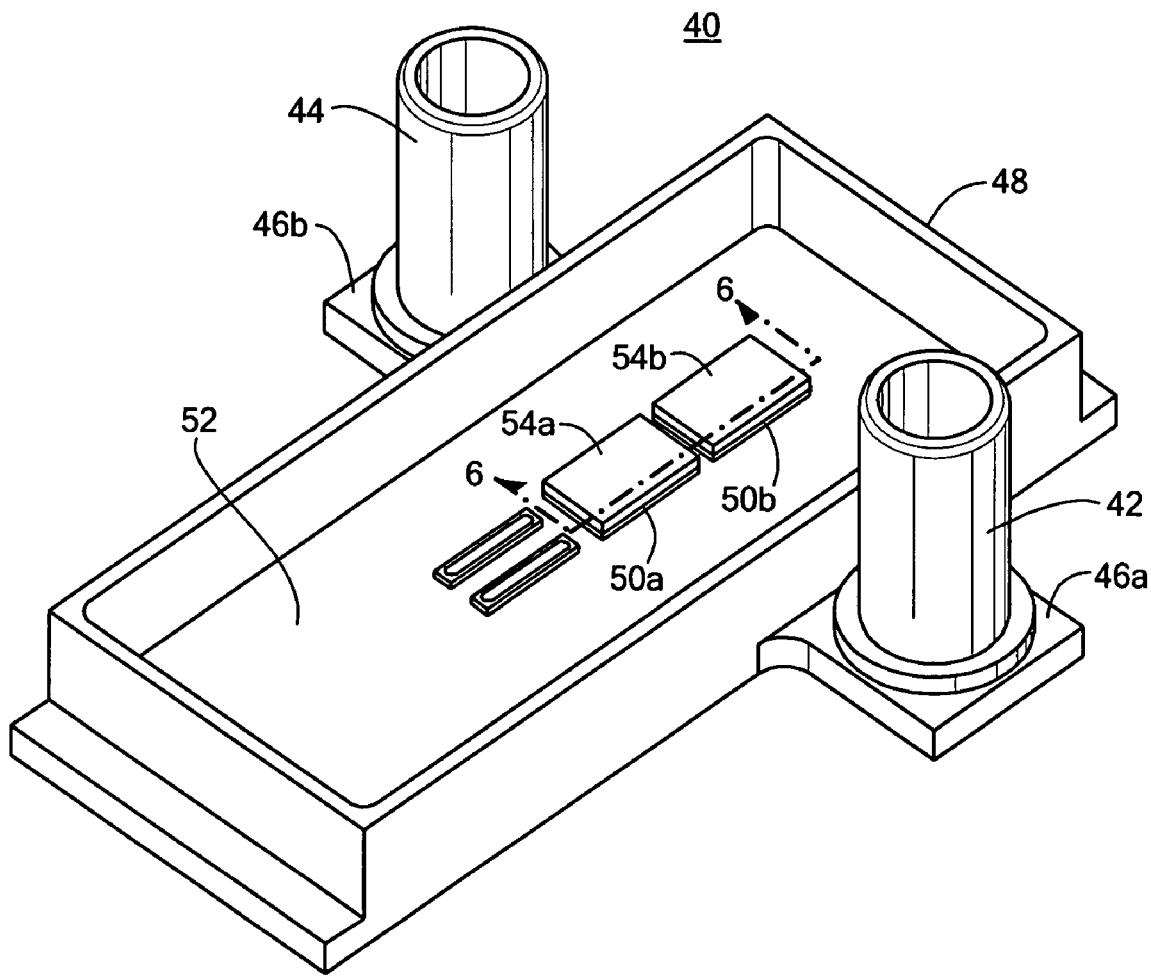
FIG. 3 is a highly schematic three-dimensional top view showing a portion of a transmit and receive module in accordance with the subject invention with two microwave circuit chips mounted thereto.
Figure 4:
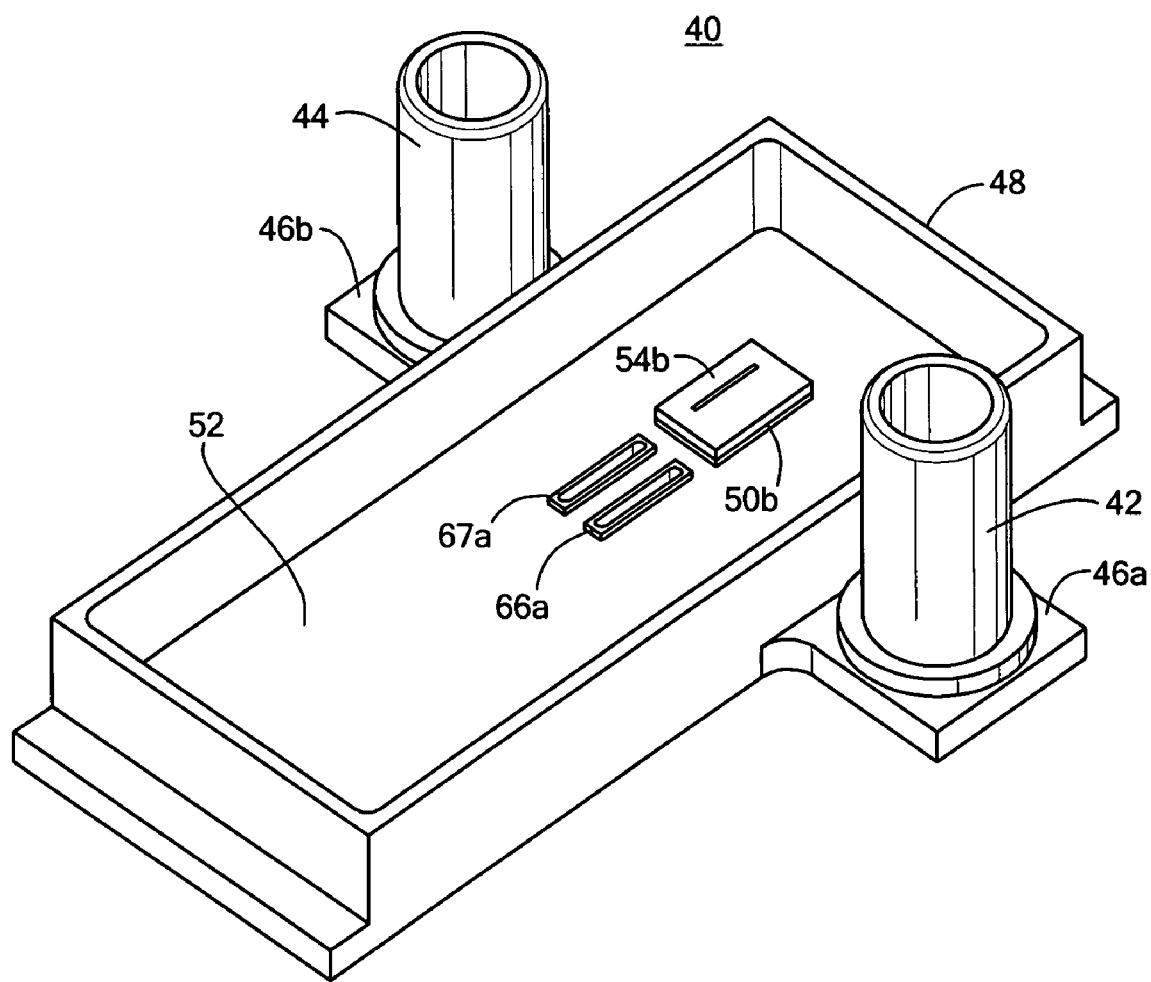
FIG. 4 is a schematic three-dimensional top view of the module shown in FIG. 3 with on microwave circuit chip removed.

In accordance with this invention, transmit and receive module 40, FIG. 3 (shown with the cover removed) includes a coolant input 42 and a coolant output 44 (e.g., nanoports or other microfluidic interconnects) on side tabs 46a and 46b, respectively. Side tabs 46a and 46b are shown here on opposite sides of module 40 package base 48 but may be located on the same side and, also, there may be additional coolant inputs and outputs depending on the specific design. In this particular example, MEMS micro heat exchangers 50a and 50b are mounted (e.g., epoxied) to package base floor 52. Preferably the gallium nitride monolithic microwave integrated circuitry 54a and 54b is integrated with the heat exchangers 50a and 50b, respectively. That is, microfluidic channels are present in the SiC substrate of the monolithic microwave integrated circuit. Typically, wire bonds (not shown) interconnect the circuitry of the MMICs 54a, 54b to other circuitry or interconnects or leads on package floor 52 (not shown). As shown in FIG. 4, package floor 52 includes inlet bosset 66a in fluid communication with coolant input 42 and outlet basset 67a in fluid communication with coolant output 44.

Figure 5:
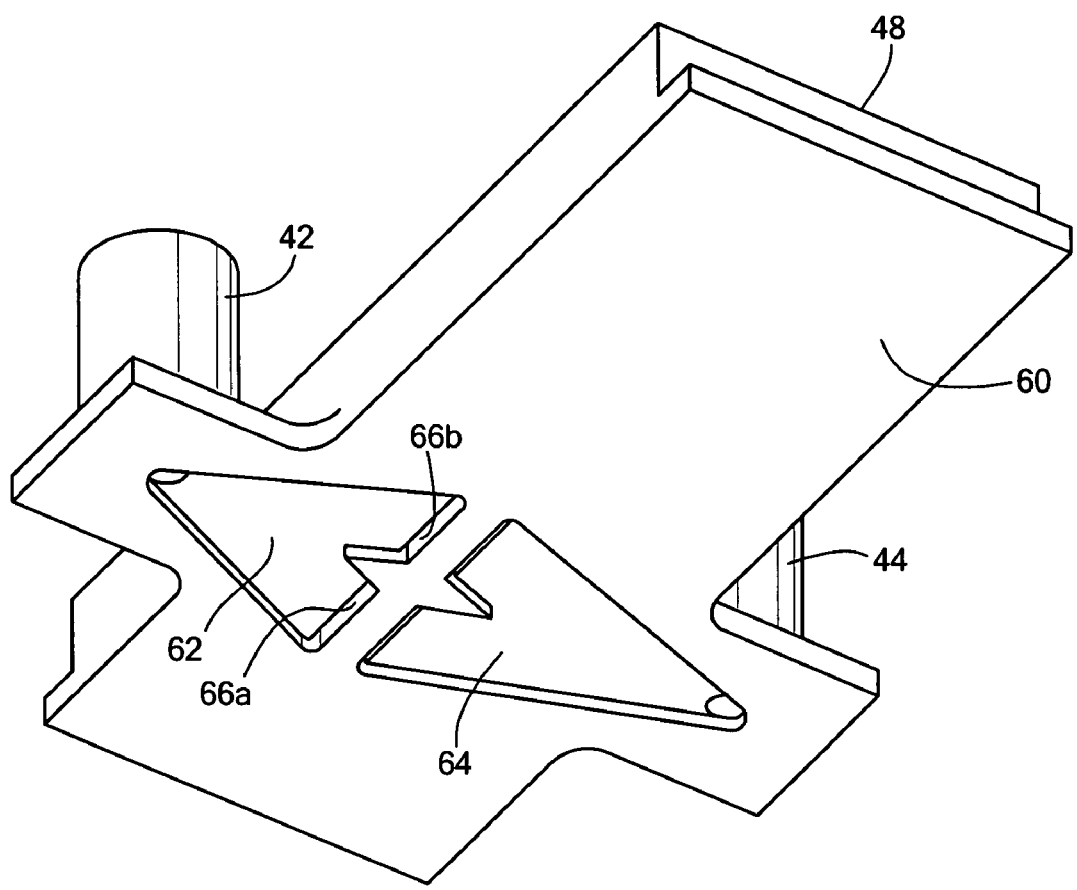
FIG. 5 is a schematic three dimensional bottom view of the transmit and receive module in FIG. 3 with the coolant distribution channels exposed.

As shown more clearly in FIG. 5, the back side 60 of package base 48 with the brazed cover removed includes fluid channels 62 and 64 therein. Fluid channel 62 connects coolant input 42 with input ports 66a and 66b. Another set of similarly configured output ports in base 48 (not shown) are in fluid communication with coolant output 44 via channel 64.

Figure 6:
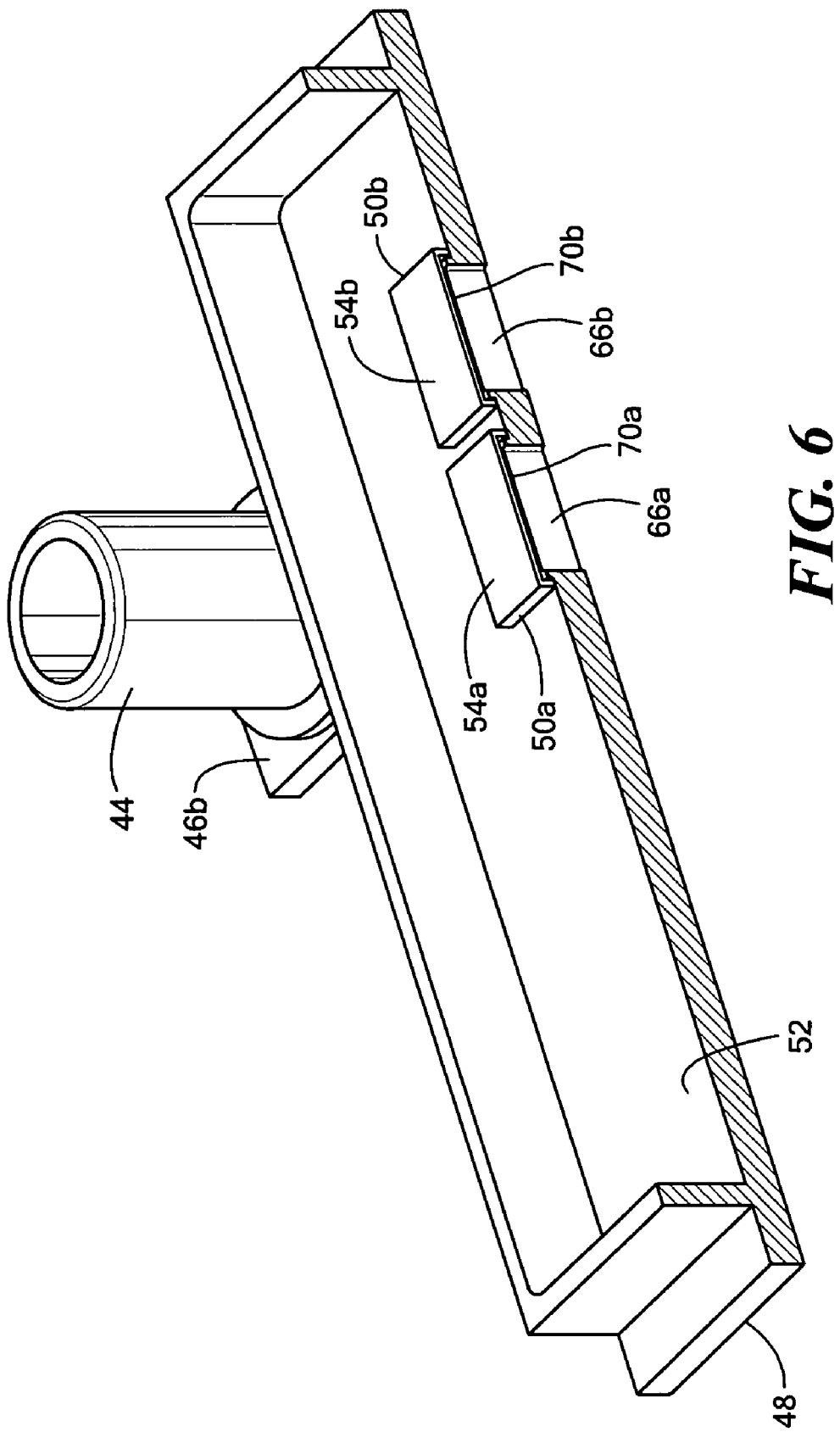
FIG. 6 is a three dimensional cross sectional view showing the transmit and receive module taken along line 6-6 of FIG. 3.
Figure 7:
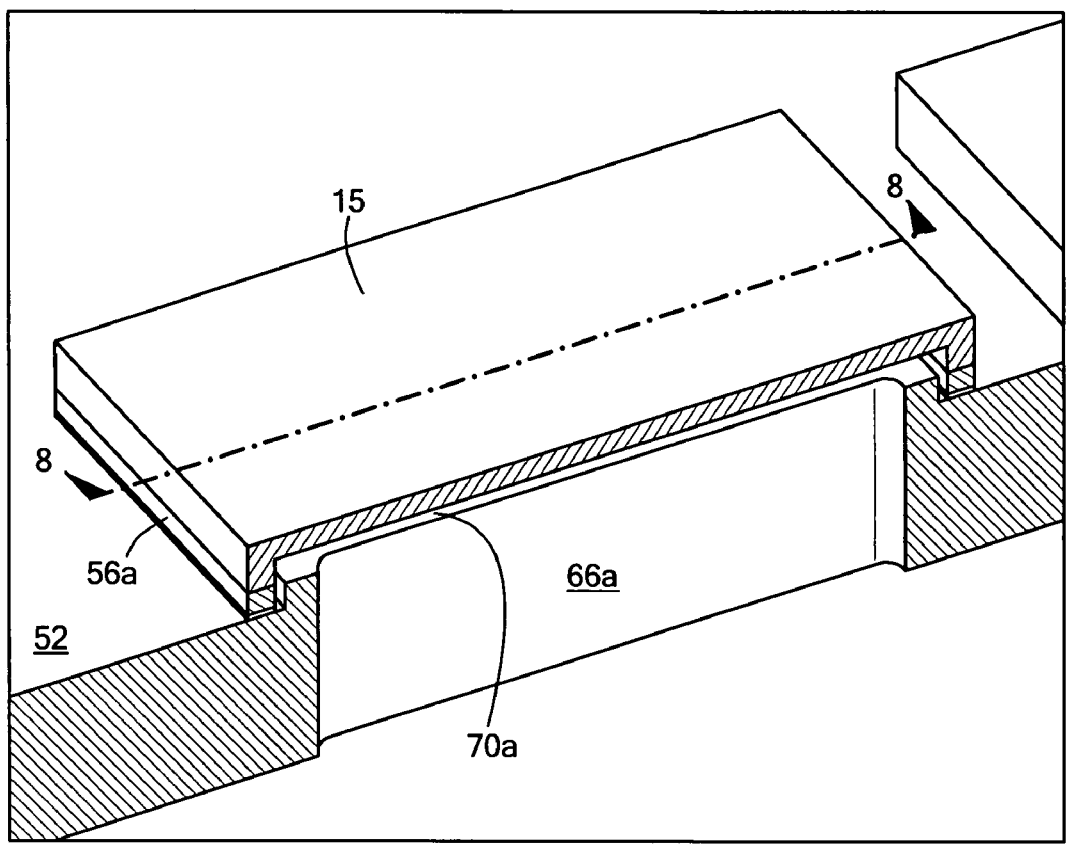
FIG. 7 is a schematic three dimensional partial cross sectional view showing in more detail a portion of a heat exchange structure shown in FIG. 5.
Figure 8:
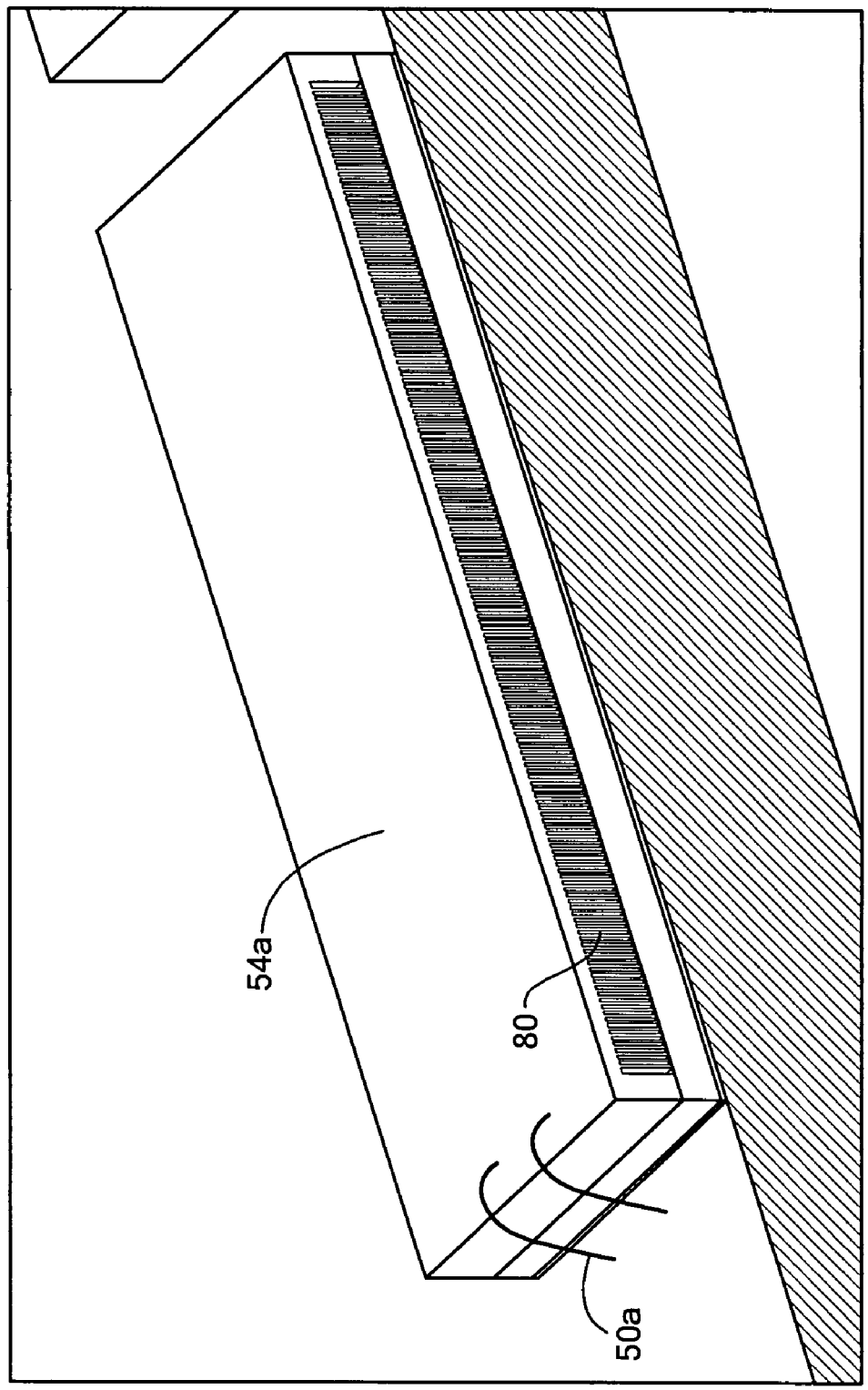
FIG. 8 is another partial three dimensional cross sectional view showing the interior of the heat transfer structure of the heat exchanger shown in FIG. 7 and taken along lines 8-8 of FIG. 7.
Figure 9:
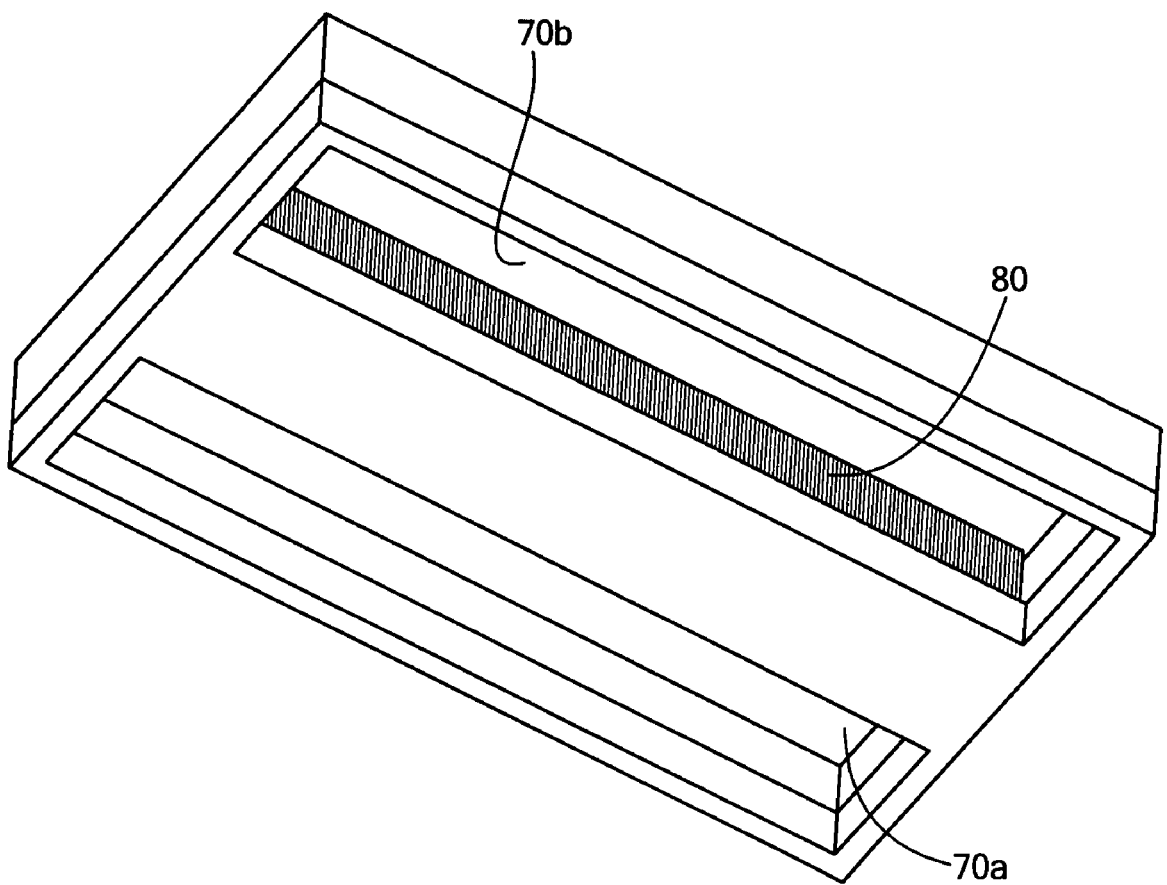
FIG. 9 is a schematic three-dimensional bottom view of the heat exchange structure of the transmit and receive module of this invention.

As shown in FIGS. 6-7 heat exchangers 50a and 50b each include an input channel 70a and 70b, respectively, for receiving fluid from the bossets in package base 52. Similarly configured output channels are located on the opposite end of each heat exchanger to provide for fluid output via the output ports through package base 60, FIG. 4, channel 64, and coolant output 44. Between the heat exchanger input and output channels is heat transfer structure such as fins 80, FIGS. 8-9 defining microfluidic heat exchange channels. Other known heat transfer structures may also be used. In this way, coolant is driven within the transmit and receive modules to directly cool them eliminating the numerous resistances associated with the prior art design shown in FIG. 2 between active circuitry 20 and coolant 36 in equipment rack 34.

A phase change coolant may be provided to fluid input 42, FIG. 3 and received from fluid output 44 in a number of different ways.

Figure 10:
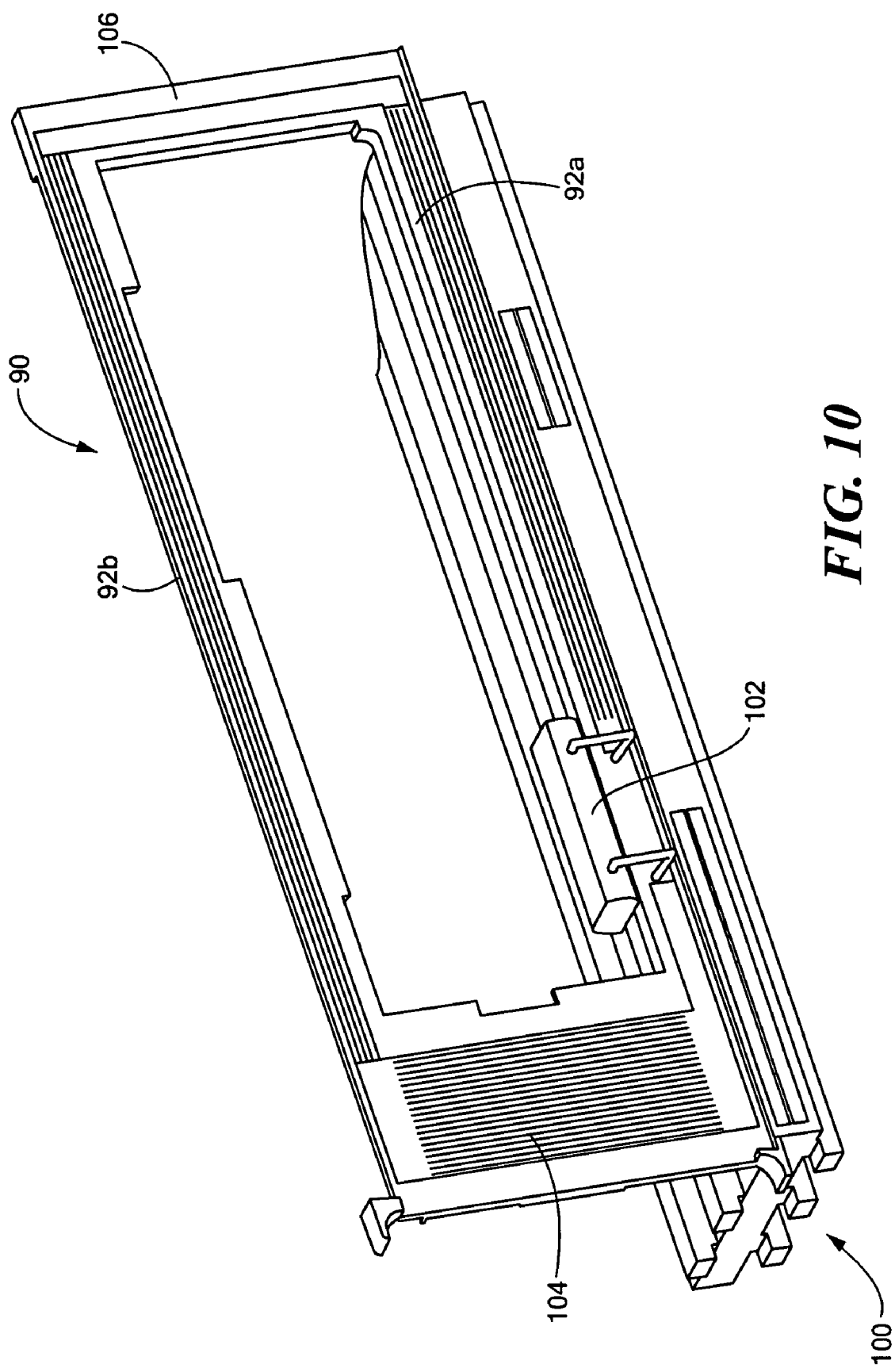
FIG. 10 is a schematic three dimensional front view showing an example of a new radar transmit and receive integrated microwave module frame in accordance with the subject invention.
Figure 11:
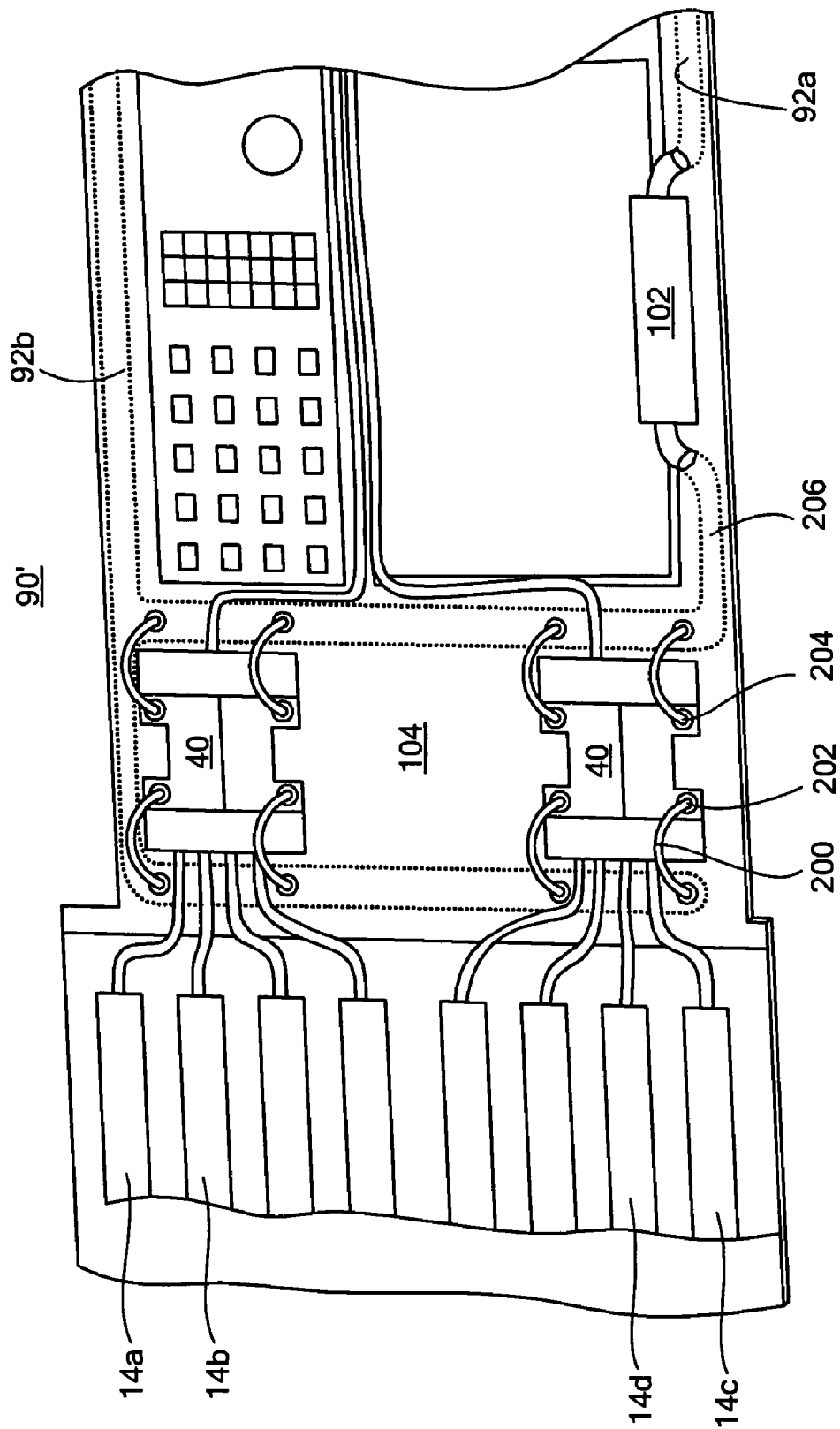
FIG. 11 is a schematic top view showing the transmit and receive integrated microwave module of FIG. 3 in place on the radar transmit and receive integrated microwave module shown in FIG. 10.

In one particular design, radar transmit and receive integrated module 90, FIG. 10 includes conductively cooled condenser side rails 92a and 92b. A portion of the relevant equipment rack is shown at 100. Miniature integrated positive displacement pump 102 pumps a liquid refrigerant (e.g., R-134a or HFC-236fa) which circulates within channels in side rail 92a to vacuum brazed fluid distribution manifold cold plate 104 also with fluidic channels therein where heat is absorbed for sub-ambient operation, a miniature compressor may be utilized. The resulting liquid/vapor mixture condenses in the fluidic channels in side rail 92b and recirculates to side rail 92a via end rail 106. Transmit and receive module 40, FIG. 3 is epoxied to cold plate 104, FIG. 10 and coolant input 42, FIG. 3 is fluidically coupled to side rail 92a, FIG. 10 while coolant output 44, FIG. 3 is fluidically coupled to side rail 92b, FIG. 10. Various microfluidic interconnects, tubing, and the like may be used as is known to those skilled in the art. Thus, FIG. 11 shows main module 90' with capillary tubing 200 connecting module 40 to a supply port 202 in communication with supply manifold as shown in relief at 205 and return port 204 in communication with a return manifold located as shown in relief at 206.

In this way, coolant is circulated through both the cold plate (or plates) of the transmit and receive integrated microwave module and also to the transmit and receive module(s) thereon and ultimately to and within the micro heat exchanger integrated with the gallium nitride monolithic microwave integrated circuitry. The result is distributed chip-level integrated cooling system to facilitate the transition to 10-20 W/mm gate power levels in gallium nitride based monolithic microwave integrated circuits. Direct multiphase cooling within the substrate on which the epitaxial layer of the gallium nitride circuitry resides eliminates many serial conduction thermal resistances associated with present designs (see FIG. 2). Direct multiphase cooling of the monolithic microwave integrated circuit substrate results in a constant temperature coolant being provided to the substrate regardless of dissipated power. Microfluidic channels (80, FIG. 3) within the substrate provide superior thermal performance enabling efficient heat transfer to the phase change coolant. Modifications to the basic radar architecture and hardware are not required and the design discussed above can be retrofitted with existing designs. The subject invention takes advantage of microfabrication technology advancements that allow the creation of MEMS devices from high performance materials such as silicon carbide and man-made diamond. Recent developments have allowed processes such as wafer bonding, deposition and epitaxial layer transfer to be conducted using materials not previously possible, resulting in the creation of complex microfluidic structure in SiC and diamond. The subject invention provides sufficient cooling when power dissipated at the individual gates of the gallium nitride monolithic microwave integrated circuit multiplies by 10-20 times, which would otherwise drastically increase the temperature rise across each part of the heat transfer path. By providing phase change coolant directly to the substrate of the monolithic microwave integrated circuit and also by maintaining a conduction heat path to the cold plate, whether it is actively cooled or not with a coolant, creates dual paths to help carry heat out of the transmit and receive module.

The temperature rise across the SiC substrate is the single most significant contributor to the temperature rise between the gate and the sink. The high temperature rise is a result of the extremely high heat flux at the monolithic microwave integrated circuit gate. And, it is notable since SiC and diamond are particularly good conductors among solid materials, the subject invention addresses this temperature rise at its source.

In accordance with the subject invention, phase change heat transfer features a very low thermal resistance at the liquid to wall boundary when properly designed to maximize wetted heat transfer area and to maintain the proper two-phase flow regime. Since most of the energy dissipated results in a phase change (rather than coolant temperature rise), phase change heat transfer allows for the use of considerably lower flow rates than are required for single phase systems. This results in reasonable pressure drops, even in microchannels. Preliminary calculations assess the pressure drop to be reasonable at 5 W/mm to 20 W/mm power levels, around 0.01 and 6 psi, respectively, assuming R-134a as the phase change coolant.

Figure 12:
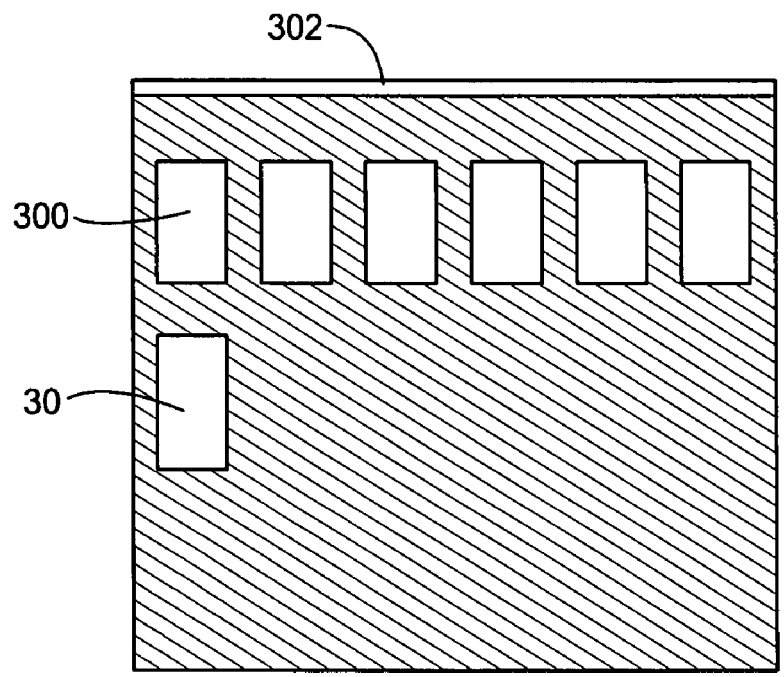
FIG. 12 is a schematic cross-sectional view showing an example of a high heat transfer area heat exchange structure in accordance with the subject invention.

In another example, the heat exchanger structure of the microwave integrated circuit includes a plurality of stacked microchannels 300, FIG. 12 in an array as shown beneath the active electronic layer 302. In one design, the module is approximately 750 μm thick and microchannels 300 are spaced approximately 5 μm vertically to maximize heat transfer area.

Figure 13:
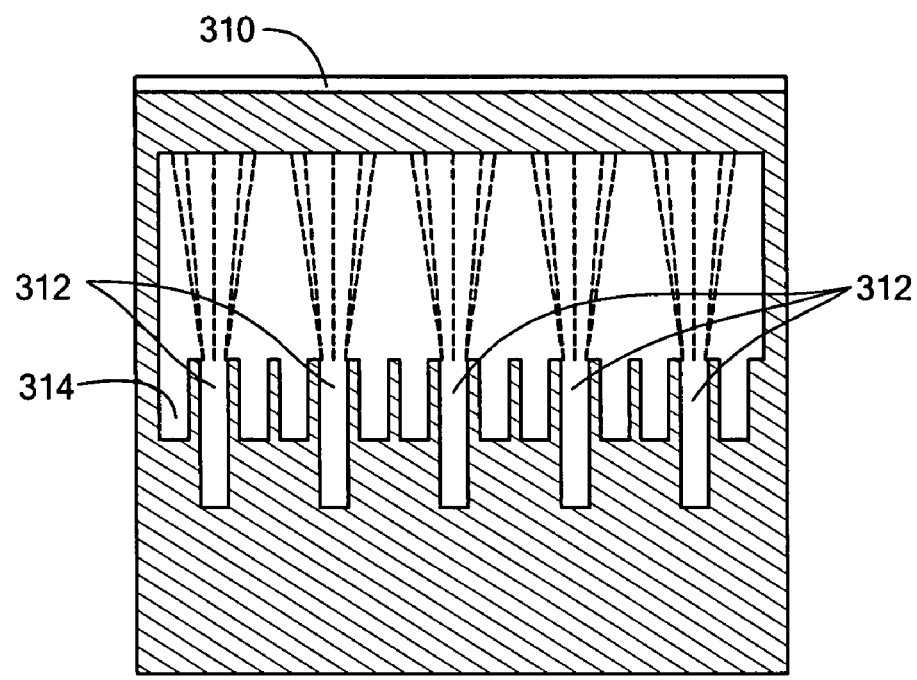
FIG. 13 is a schematic cross-sectional view of still another example of a heat exchanger structure featuring change of phase impinging jets in accordance with the subject invention.

In still another example, the heat exchanger structure beneath active electronic layer 310, FIG. 13 includes an array of jets or spray nozzles 312 which deliver a jet or spray of fluid as shown. Other channels such as channel 314 serve as the return channels and are connected to the output channel/output port of the module.

Although specific features of the invention are shown in some drawings and not in others, however, this is for convenience only as each feature may be combined with any or all of the other features in accordance with the invention. Also, the words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A radar transmit and receive integrated microwave module comprising:
   conductively cooled condenser side rails;
   one or more vacuum brazed fluid distribution manifold cold plates in fluid communication with the side rails;
   one or more transmit and receive modules on a cold plate, each module including a coolant input and a coolant output; and
   one or more gallium nitride monolithic microwave integrated circuits within each transmit and receive module and each including a micro heat exchanger in fluid communication with the coolant input and the coolant output of the transmit and receive module to directly cool the gallium nitride monolithic microwave integrated circuit.

2. The radar transmit and receive integrated microwave module of claim 1 in which each transmit and receive module includes a package substrate with an input port and an output port therein in fluid communication with the coolant input and coolant output, respectively.

3. The radar transmit and receive integrated microwave module of claim 2 in which each gallium nitride monolithic microwave integrated circuit micro heat exchanger includes an input channel in fluid communication with the input port, an output channel in fluid communication with the output port, and a heat transfer structure between the input channel and the output channel.

4. The radar transmit and receive integrated microwave module of claim 3 in which the heat transfer structure includes fins.

5. The radar transmit and receive integrated module of claim 1 further including a phase change coolant within the conductively cooled condenser side rails.

6. The radar transmit and receive integrated microwave module of claim 3 in which the heat transfer structure includes plurality of stacked microchannels.

7. The radar transmit and receive integrated microwave module of claim 3 in which the heat transfer structure includes an array of spray nozzles or impinging jets.

8. The radar transmit and receive integrated microwave module of claim 1 further including a miniature pump for pumping fluid through the side rails.

9. The radar transmit and receive integrated microwave module of claim 1 further including a miniature compressor for sub-ambient cooling and moving fluid through the side rails.

10. A radar module comprising:
cooled rails;
one or more cold plates;
one or more transmit and receive modules on a cold plate, each transmit and receive module including a coolant input and a coolant output in fluid communication with the cooled rails; and
one or more microwave integrated circuits within each transmit and receive module each including a heat exchanger for receiving coolant to directly cool the microwave integrated circuit.

11. A radar module comprising:
at least one cold plate;
at least one transmit and receive module on the cold plate, said each module including a coolant input and a coolant output;
a microwave circuit within said module; and
a heat exchanger integrated with the microwave circuit in fluid communication with the coolant input and coolant output to directly cool the microwave circuit.

* * * * *